United States Patent
Iwata et al.

(10) Patent No.: US 7,170,789 B2
(45) Date of Patent: Jan. 30, 2007

(54) SEMICONDUCTOR STORAGE DEVICE AND ELECTRONIC EQUIPMENT

(75) Inventors: Hiroshi Iwata, Nara-ken (JP); Yoshifumi Yaoi, Nara-ken (JP); Akihide Shibata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/213,927

(22) Filed: Aug. 30, 2005

(65) Prior Publication Data

US 2006/0044886 A1 Mar. 2, 2006

(30) Foreign Application Priority Data

Aug. 30, 2004 (JP) .......................... P2004-249852

(51) Int. Cl.
G11C 11/34 (2006.01)
G11C 7/00 (2006.01)

(52) U.S. Cl. .............................. 365/185.2; 365/185.05; 365/210

(58) Field of Classification Search ............. 365/185.2, 365/185.05, 210; 257/315, 316
See application file for complete search history.

(56) References Cited

U.S. PATENT DOCUMENTS 5,616,510 A * 4/1997 Wong .......................... 438/259
5,768,184 A * 6/1998 Hayashi et al. ........ 365/185.03
5,776,787 A * 7/1998 Keshtbod ..................... 438/257
2004/0160828 A1 8/2004 Iwata et al.
2004/0164359 A1 8/2004 Iwata et al.

FOREIGN PATENT DOCUMENTS

| JP | 6-60676 A | 3/1994 |
|---|---|---|
| JP | 6-176583 A | 6/1994 |
| JP | 2004-221546 A | 8/2004 |

\* cited by examiner

*Primary Examiner*—Son T. Dinh
(74) *Attorney, Agent, or Firm*—Birch, Stewart, Kolasch & Birch, LLP

(57) ABSTRACT

Characteristic fluctuation of a reference cell due to read disturb is prevented. A memory cell 27*m* and a reference cell 27*r* respectively have memory function bodies that are formed on both sides of a gate electrode and have a function to retain electric charge or polarization. The memory cell 27*m* can store independent information pieces in memory function bodies 27*mr* and 27*ml* located on both sides of the gate electrode and the independent information pieces are read therefrom. On the other hand, in the reference cell 27*r*, only the information piece stored in a memory function body 27*rl* located on one side of the gate electrode is referred to in a sense amplifier 22.

11 Claims, 10 Drawing Sheets

SEMICONDUCTOR STORAGE DEVICE AND ELECTRONIC EQUIPMENT

This nonprovisional application claims priority under 35 U.S.C. §119(a) on Patent Application No. 2004-249852 filed in Japan on Aug. 30, 2004, the entire contents of which are hereby incorporated by reference.

BACKGROUND OF THE INVENTION

The present invention relates to a semiconductor storage device and electronic equipment provided with the device, and relates more concretely to a semiconductor storage device in which field-effect transistors each of which has a memory function body having a function to retain electric charge or polarization and electronic equipment provided with the semiconductor storage device.

As a typical nonvolatile memory used conventionally, a flash memory can be given. FIG. 9A shows a sectional view of a flash memory.

In the flash memory, as shown in FIG. 9A, a gate insulation film 151, a floating gate 152, an insulation film 157 and a word line (control gate) 153 are formed in this order on a semiconductor substrate 150, and a source line 154 and a bit line 155 are formed of a diffusion region on both sides of the floating gate 152, forming a memory cell. An element isolation region 156 is formed around the memory cell.

The symbol shown in FIG. 9B is hereinafter used as the circuit symbol of the flash memory. FIG. 9B shows a control gate 153 that forms the word line, a diffusion region 154 that forms a source line, and a diffusion region 155 that forms a bit line.

FIG. 10 shows a read circuit generally used in the flash memory. Referring to FIG. 10, when the information piece stored in, for example, a memory cell 166m2 is read, the memory cell 166m2 is selectively turned on by making a word line 167m2 go H (High) level. On the other hand, a reference cell 166r is also turned on, and by comparing an output 163m from the memory cell 166m2 via a bit line 168m with an output 163r from the reference cell 166r via a bit line 168r in a sense amplifier 162, the information piece stored in the floating gate of the memory cell 166m2 is read.

It is noted that the reference numerals 165m and 165r denote column selectors, and the reference numerals 164m and 164r denote field-effect transistors (FET's) each of which operates as a load resistance during read.

In general, numbers of memory cells are connected to one bit line for areal reduction. Taking the variations in the characteristics of the memory cells, a noise margin and so on into consideration, the reference cell needs to be accurately set at the desired level in order to execute read without malfunction. Therefore, the reference cell 166r employs an element that has the same configuration and characteristics as those of the memory cells 166m1, 166m2, . . . and is programmed in a state intermediate between a program state and an erase state.

Moreover, it is also desirable to match the capacitance of the bit line extending from the memory cell to the sense amplifier with that of the reference cell to the utmost. Therefore, a technique for making the memory cell and the reference cell share the word line to equalize the number of elements connected to one bit line, a technique for adding a dummy capacitance to a path extending from the reference cell to the sense amplifier and so on are proposed (refer to JP H06-60676 A and JP H06-176583 A).

However, the reference cell has an increased frequency of read relative to that of the memory cell. Therefore, when an element that has the same structure as that of the memory cells 166m1, 166m2, . . . and is programmed in a state intermediate between the program state and the erase state is employed as the reference cell 166r as shown in FIG. 10, a so-called read disturb phenomenon such that not carriers, which have been generated in a small amount at each occasion of voltage application during read to be repeated, have exerted a bad influence on the state of electric charge stored in the floating gate and caused a change in the current level of the reference cell, has been a problem.

The problem of read disturb has been a serious problem particularly when information of more than one bit has been stored in one memory cell, and this has caused a reduction in read speed and read error because a sufficient margin has not been able to be secured between the output from the memory cell and the output from the reference cell.

SUMMARY OF THE INVENTION

The present invention has been accomplished in view of the problems and has the object of providing a semiconductor storage device capable of reducing the fluctuations in the device characteristics of the reference cell attributed to read disturb and electronic equipment that employs the semiconductor storage device.

In order to solve the problem, the semiconductor storage device of the present invention comprises:

a memory cell array in which a plurality of memory cells for storing information pieces are arranged;

a sense amplifier for reading information pieces stored in the memory cells; and one or a plurality of reference cells referred to read data stored in the memory cells by the sense amplifier, wherein
each of the memory cell and the reference cell comprises:
a gate electrode formed via a gate insulation film on a semiconductor layer;
a channel region arranged under the gate electrode via the gate insulation film;
diffusion regions, which are arranged on both sides of the channel region and have a conductive type opposite to a conductive type of the channel region; and
memory function bodies, which are formed on both sides of the gate electrode and have a function to retain electric charge or polarization, wherein
in each of the memory cells, information pieces independent from each other are stored in the memory function bodies located on both sides of the gate electrode, and the information pieces are independently read from the memory function bodies, and wherein
in the reference cell, only the information piece stored in the memory function body located on one side of the gate electrode is referred to.

According to the construction, in the reference cell, only the information piece stored in the memory function body located on one side of the gate electrode is referred to, and the memory function body (whose state of electric charge is influenced by hot carriers generated in a small amount during read of the memory function body located on the one side) located on the side opposite from the memory function body on one side across the gate electrode is not referred to. Therefore, the fluctuations in the characteristics of the reference cell attributed to the read disturb can be reduced to the ignorable extent. More in detail, when the information piece stored in the one memory function body located on one side with respect to the gate electrode of the reference cell is read, it is possible that hot electrons are generated in a small amount in the neighborhood of the diffusion region near the other memory function body and the hot electrons enter the other memory function body. However, since either one of the memory function bodies located on both sides of the gate electrode is referred to as described above, even if the storage state of the memory function body located on the side opposite with respect to the gate electrode from the memory function body referred to suffers the read disturb during read operation, the storage state of the memory function body located on the opposite side across the gate electrode exerts little influence on the read current. Therefore, the fluctuations in the characteristics of the reference cell during read can be reduced to the ignorable extent.

In one embodiment, the memory function body to be referred to in the reference cell and the memory function body located on a side opposite with respect to the gate electrode from the memory function body to be referred to in the reference cell are both written in a state intermediate between a program state and an erase state.

According to the embodiment, the memory function bodies located on both sides of the gate electrodes of all the reference cells are in the state intermediate between the program state and the erase state. Therefore, the states of all the memory function bodies can be unified, and the states of all the memory function bodies located on the side opposite from the memory function bodies referred to are made identical. Consequently, a variation in the reference current attributed to the charge state of the memory function body located on the opposite side can be suppressed, and an appropriate threshold value for distinguishing between the program state and the erase state can be obtained.

In one embodiment, the reference cells comprise at least first and second reference cells, the memory function body referred to in the first reference cell is in the program state, and the memory function body referred to in the second reference cell is in the erase state.

According to the embodiment, the memory function body referred to in the first reference cell is in the program state and has the same storage state as that of the memory cell in the program state. Moreover, the memory function body referred to in the second reference cell is in the erase state and has the same storage state as that of the memory cell in the erase state. Therefore, the characteristics of the memory cell and the first and second reference cells vary with same tendency with respect to the changes in the applied voltage, ambient temperature and the like, and read operation of higher reliability can be achieved.

In one embodiment, the memory function body located on a side opposite with respect to the gate electrode from the memory function body in the program state referred to in the first reference cell is in the erase state.

According to the embodiment, the first reference cell is in a storage state similar to that in the worst case of the memory cell. Therefore, no significant change occurs in the current difference between the current that flows from the reference cell and the current that flows from the memory cell in the worst case with respect to the changes in the applied voltage, ambient temperature and the like, and read operation of higher reliability can be achieved.

Furthermore, the memory function bodies located on the side opposite with respect to the gate electrode from the memory function bodies in the program state referred to in the first reference cell are totally identical in the erase state. Therefore, a variation in the reference current attributed to the charge state of the memory function body on the opposite side can be suppressed.

In one embodiment, the memory function body located on a side opposite with respect to the gate electrode from the memory function body in the erase state referred to in the second reference cell is in the program state.

According to the embodiment, the second reference cell is in a storage state similar to that in the worst case of the memory cell. No significant change occurs in the current difference between the current that flows from the reference cell and the current that flows from the memory cell in the worst case with respect to the changes in the applied voltage, ambient temperature and the like, and read operation of higher reliability can be achieved.

Moreover, the memory function bodies located on the side opposite with respect to the gate electrode from the memory function bodies in the erase state referred to in the second preference cell are totally identical in the program state. Therefore, a variation in the reference current attributed to the charge state of the memory function body on the opposite side can be suppressed.

In one embodiment, by comparing double of a current supplied from the memory cell with a sum of currents supplied from the first and second reference cells in the sense amplifier, the information piece stored in the memory function body of the memory cell is read.

According to the embodiment, the double of the current supplied from the memory cell is compared with the sum of the currents supplied from the first and second reference cells. Therefore, highly reliable read with a sufficient margin can be achieved.

In one embodiment, a number of stages of column selectors existing between the memory cell and the sense amplifier is equal to a number of stages of column selectors existing between the reference cell and the sense amplifier.

According to the embodiment, the number of stages of the column selectors existing between the memory cell and the sense amplifier is equal to the number of stages of the column selectors existing between the reference cell and the sense amplifier Therefore, the influence of a voltage drop attributed to the on-state resistance of the column selector can be roughly equalized on the memory cell side and the reference cell side. Therefore, highly accurate read can be performed.

One embodiment comprises a reference cell array constituted of the reference cells, wherein the memory cell array and the reference cell array are respectively constituted of a virtual ground array architecture.

According to the embodiment, the occupation area of the device can be reduced.

In one embodiment, the number of reference cells connected in series in the reference cell array is equal to the number of memory cells connected in series in the memory cell array.

According to the embodiment, the characteristics of the wiring capacitances of the reference cell array and the memory cell array and the like can be equalized. Therefore, highly reliable read can be performed. Particularly, in the case of the virtual ground array architecture, it is possible to more strictly reflect the influence of the sneak current and achieve highly reliable read operation.

One embodiment comprises a read controller for executing control to refer to only the information piece stored in the memory function body located on one side among the memory function bodies located on both sides of the gate electrode of the reference cell.

Electric equipment of one embodiment comprises the above semiconductor storage device.

The electronic equipment, which has the semiconductor storage device, therefore has the advantages of high reliability and inexpensiveness.

According to the present invention, it is possible to store information pieces of an amount greater than one bit in one memory cell, reduce the fluctuations in the element characteristics of the reference cell attributed to read disturb to the ignorable extent and provide a highly reliable inexpensive semiconductor storage device.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

Figure 1A:
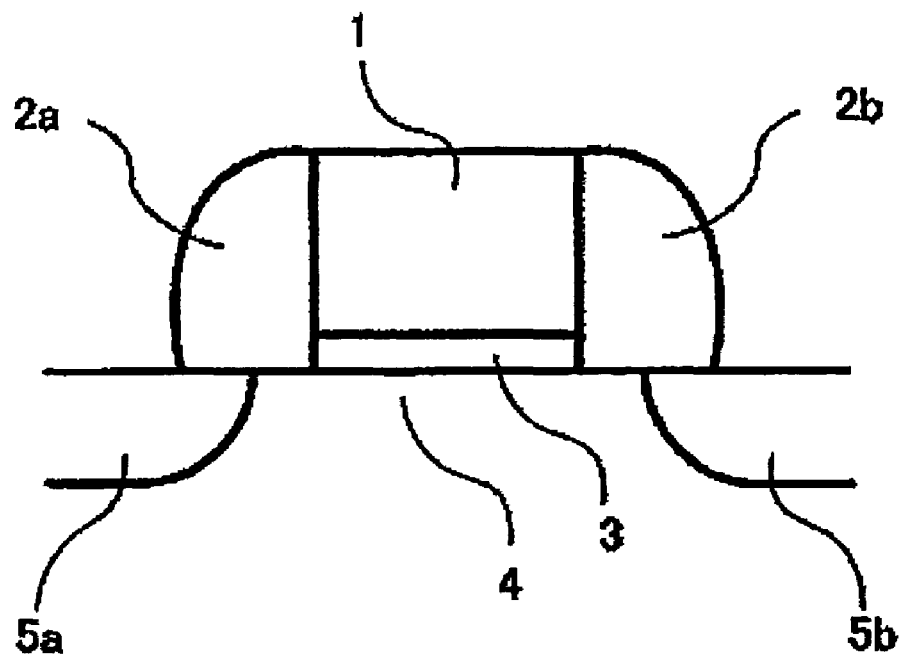
FIG. 1A is a sectional view of a memory cell in a semiconductor storage device of the present invention.

FIG. 1A shows a sectional view of a memory cell included in a semiconductor storage device of the present invention.

In the memory cell shown in FIG. 1A, a gate electrode 1 is formed via a gate insulation film 3 on a p-type well region 4 formed on a semiconductor substrate. Memory function bodies 2a and 2b, which practically retain electric charge or polarization specified by rewrite operation, are provided on side surfaces of the gate electrode 1. N-type diffusion regions 5a and 5b, each of which functions as a source region or a drain region, are formed in the p-type well region 4 in the proximity of both sides of the gate electrode 1. The diffusion regions 5a and 5b have an offset structure. That is, the diffusion regions 5a and 5b do not reach the region under the gate electrode 3, and offset regions under the memory function bodies 2a and 2b constitute part of a channel region.

As a retention film having a function to retain electric charge or polarization in the memory function bodies 2a and 2b, a silicon nitride film, ferroelectric film or the like can be used. With regard to the structure of the memory function bodies 2a and 2b, the upper and lower sides of the retention film may each be covered with an insulating film represented by silicon oxide film in order to retain electric charge or polarization for a longer term. For example, when silicon nitride film is used as a retention film having a function to retain electric charge, the memory function bodies 2a and 2b may have a three-layer structure of silicon oxide film-silicon nitride film-silicon oxide film.

Moreover, as another structural example of the memory function bodies 2a and 2b, it is acceptable to provide a structure in which particles constructed of a conductor or a semiconductor of a nanometer size are distributed in the form of scattered dots in the insulating film.

It is noted that the structure of the memory function bodies 2a and 2b is not limited to the construction but allowed to be another structure so long as it has a function to retain electric charge or polarization.

Program (write) operation of the memory cell shown in FIG. 1A is described below. Here is described a case where the entire bodies of the memory function bodies 2a and 2b have a function to retain electric charge. Moreover, when the memory cell is of the n-channel type, the program (write) means injecting electrons into the memory function bodies 2a and 2b. The memory cell is hereinafter described as the n-channel type.

In order to execute program (write) by injecting an electron into the memory function body 2b, the n-type diffusion region 5a is used as a source electrode, and the n-type diffusion region 5b is used as a drain electrode. For example, a voltage of 0 V is applied to the diffusion region 5a and the p-type well region 4, a voltage of +5 V is applied to the diffusion region 5b, and a voltage of +5 V is applied to the gate electrode 1.

According to the voltage conditions, an inversion layer extends from the diffusion region 5a (source electrode) and does not reach the diffusion region 5b (drain electrode), generating a pinch-off point. Electron is accelerated from the pinch-off point to the diffusion region 5b (drain electrode) by a high electrical field and becomes a so-called hot electron (conduction electron of high energy). Write is achieved by injecting the hot electron into the memory function body 2b. Since no hot electron is generated in the neighborhood of the memory function body 2a, write is not achieved.

On the other hand, in order to execute program by injecting an electron into the memory function body 2a, the diffusion region 5b is used as the source electrode, and the diffusion region 5a is used as the drain electrode. For example, a voltage of 0 V is applied to the diffusion region 5b and the p-type well region 4, a voltage of +5 V is applied to the diffusion region 5a, and a voltage of +5 V is applied to the gate electrode 1.

As described above, by interchanging the source and drain regions in the case where an electron is injected into the memory function body 2b, program (write) of the memory function body 2a is executed by injecting an electron into the memory function body 2a.

Next, erase operation is described.

In order to erase the information piece stored in the memory function body 2a, a positive voltage (e.g., +5 V) is applied to the diffusion region 5a and a voltage of 0 V is applied to the p-type well region 4 to apply a reverse bias to a pn junction between the diffusion region 5a and the p-type well region 4, and a negative voltage (e.g., −5 V) is further applied to the gate electrode 1. At this time, particularly a potential slope becomes steep in the neighborhood of the gate electrode 1 at the pn junction by the influence of the gate electrode 1 to which the negative voltage is applied. Therefore, a hot hole (hole of high energy) is generated on the p-type well region 4 side of the pn junction due to band-to-band tunneling. The hot hole is drawn toward the gate electrode 1 that has a negative potential, and the hole is consequently injected into the memory function body 2a. Erase of the memory function body 2a is thus executed. At this time, it is proper to apply a voltage of 0 V to the diffusion region 5b.

When the information piece stored in the memory function body 2b is erased, it is proper to interchange the potentials of the diffusion region 5a and the diffusion region 5b in the above case.

Next, a method for reading the thus-stored information piece is described next.

When the information piece stored in the memory function body 2a is read the memory cell is operated by using the diffusion region 5a as the source electrode and using the diffusion region 5b as the drain electrode. For example, a voltage of 0 V is applied to the diffusion region 5a and the p-type well region 4, a voltage of +1.8 V is applied to the diffusion region 5b, and a voltage of +2 V is applied to the gate electrode 1. In this case, when no electron has been stored in the memory function body 2a, a drain current easily flows. When electrons have been stored in the memory function body 2a, the drain current hardly flows since the inversion layer is not easily formed in the neighborhood of the memory function body 2a. Therefore, by detecting the drain current, the storage information piece of the memory function body 2a can be read. At this time, the presence or absence of charge storage in the memory function body 2b exerts no significant influence on the drain current since the neighborhood of the drain is in the pinch-off state.

When the information piece stored in the memory function body 2b is read, the memory cell is operated by using the diffusion region 5b as the source electrode and using the diffusion region 5a as the drain electrode. For example, it is proper to apply a voltage of 0 V to the diffusion region 5b and the p-type well region 4, a voltage of +1.8 V to the diffusion region 5a and a voltage of +2 V to the gate electrode 1.

As described above, by interchanging the source/drain regions reversely to source/drain regions in the case where the information piece stored in the memory function body 2a is read, the information piece stored in the memory function body 2b can be read.

As described above, it is possible to store and read two bits per memory cell by interchanging the source and drain electrodes.

It is noted that the voltages applied to the terminals during the program, erase and read operations are not limited to the values but allowed to be not lower than or not higher than them.

Figure 10:
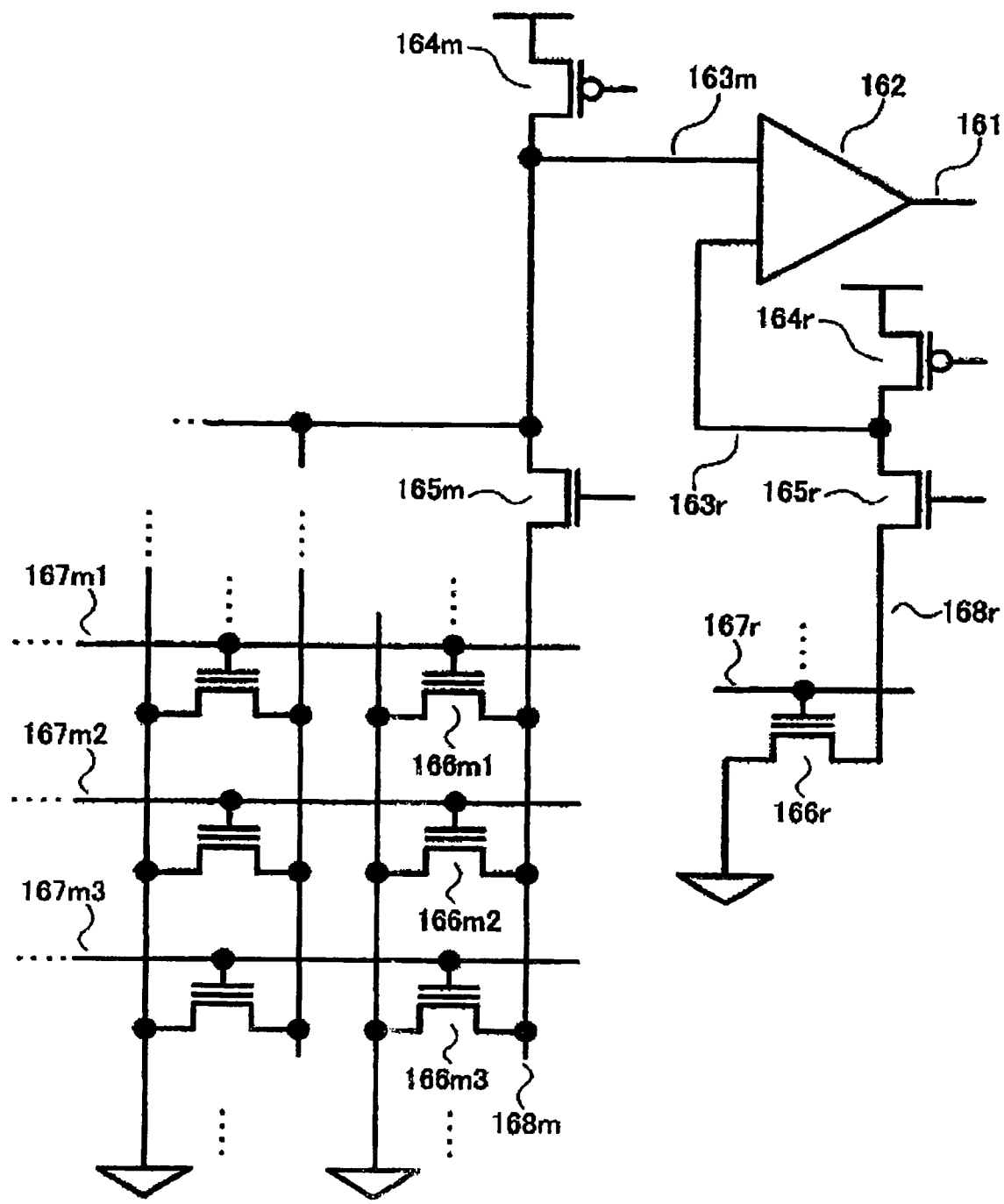
FIG. 10 is a circuit diagram of the conventional flash memory.

The memory cell shown in FIG. 1A has a structure similar to that of the transistor element generally used in the logic circuit in comparison with the conventional flash memory shown in FIG. 10A and also has an advantage that a consolidation process with the memory part and the logic circuit part is simple.

Moreover, the structure has an advantage that it is easy to reduce the film thickness of the gate insulation film and achieve scale-down.

Figure 1B:
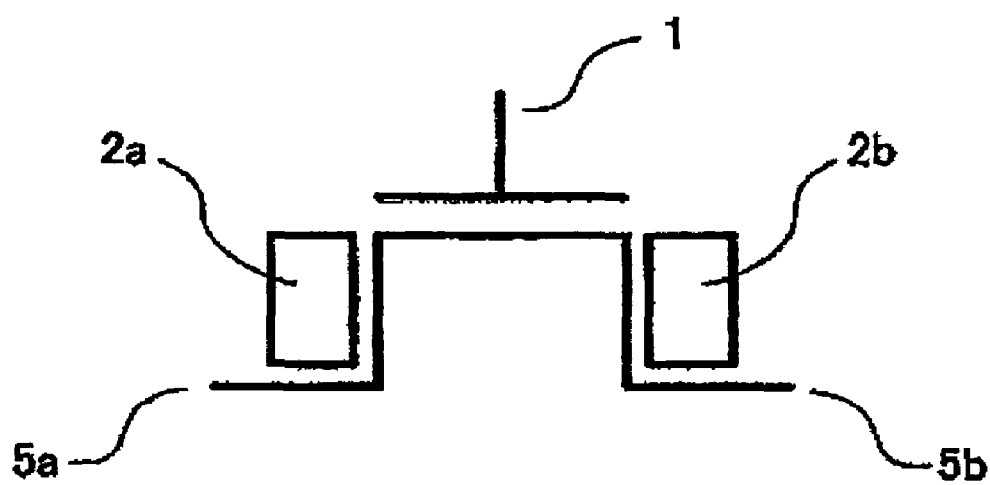
FIG. 1B is a circuit symbol of the memory cell in the semiconductor storage device.

Hereinafter, the symbol shown in FIG. 1B is used as the circuit symbol of the memory cell shown in FIG. 1A.

(First Embodiment)

Figure 2:
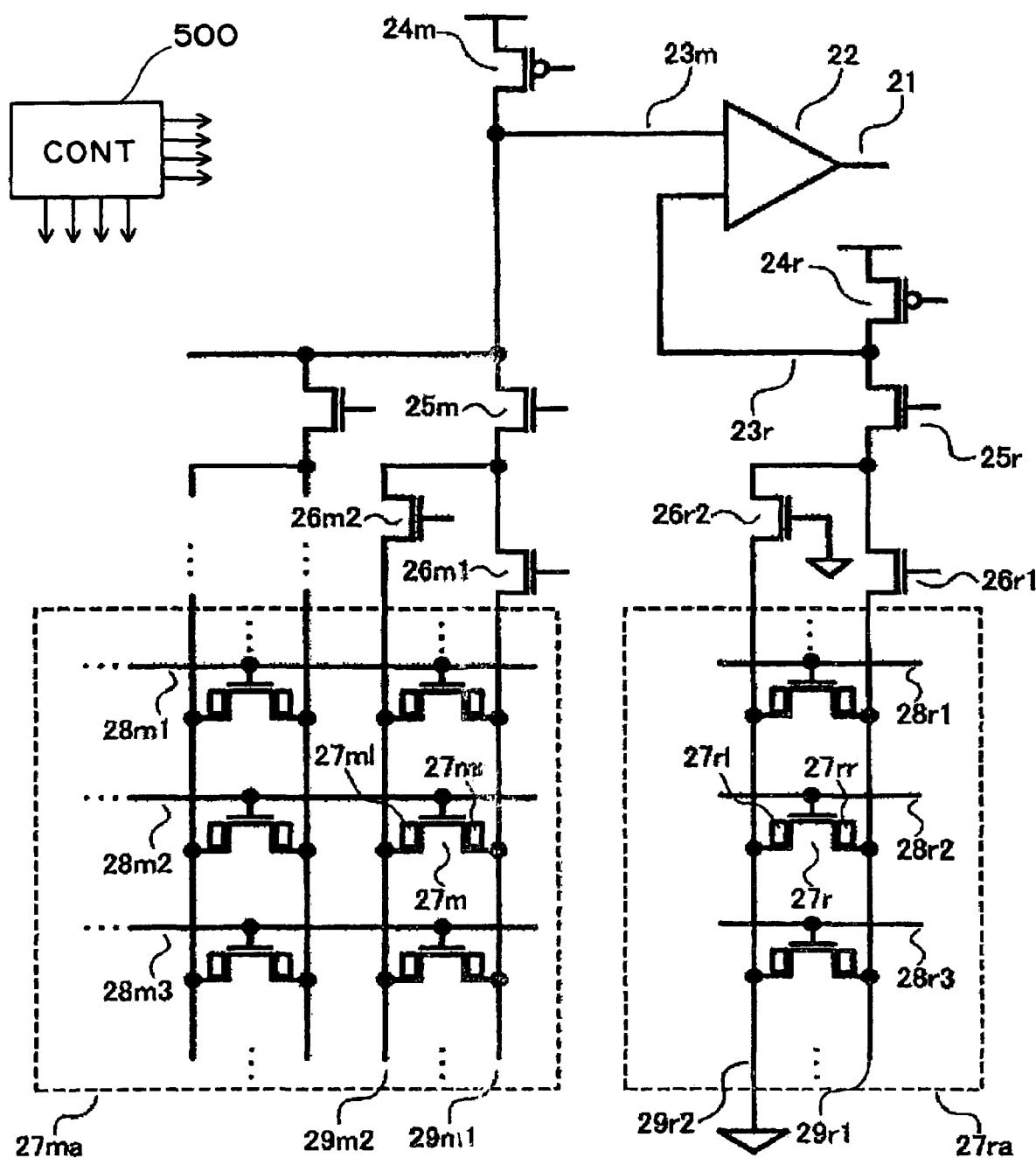
FIG. 2 is a circuit diagram of one embodiment of the semiconductor storage device of the present invention.

FIG. 2 shows the first embodiment of the semiconductor storage device of the present invention.

Memory cells 27m that constitute a memory cell array 27ma are connected to a sense amplifier 22 through column selectors 26m1, 26m2 and 25m. On the other hand, reference cells 27r that constitute a reference cell array 27ra are also connected to the sense amplifier 22 through column selectors 26rl and 25r. In the sense amplifier 22, an output 23m from the memory cell 27m and an output 23r from the reference cell 27r are compared with each other, and the information pieces stored in the memory cell 27m is consequently read. It is noted that reference numerals 24m and 24r denote field-effect transistors (FET's) each of which operates as a load resistance during read, and reference numerals 29m1, 29m2, 29r1 and 29r2 denote bit lines.

In the semiconductor storage device of the present first embodiment, both the memory cell 27m and the reference cell 27r have the structure shown in FIG. 1A. In the memory cell 27m of FIG. 2, the memory function bodies 27ml and 27mr located on both sides of the gate electrode are able to independently store information pieces. The information pieces are independently read therefrom. On the other hand, in the reference cell 27r, information piece stored in either one of the memory function bodies 27rl and 27rr located on both sides of the gate electrode is only referred to.

When the information piece stored in the memory function body 2b is read in the memory element shown in FIG. 1A, the memory cell is operated by using the diffusion region 5b as a source electrode and using the diffusion region 5a as a drain electrode. For example, it is proper to apply a voltage of 0 V to the diffusion region 5b and the p-type well region 4, a voltage of +1.8 V to the diffusion region 5a and a voltage of +2 V to the gate electrode 1. However, it is possible that hot electrons are generated in a small amount at the drain edge at this time and the electrons are injected into the memory function body 2a.

Particularly when the memory device shown in FIG. 1A is used as the reference cell 27r and the memory function bodies 2a and 2b located on both sides of the gate electrode 1 are referred to as in the memory cell read operation, the frequency of read of the reference cell 27r generally becomes greater than the frequency of read of the memory cell 27m. Therefore, the device characteristics of the reference cell are fluctuated by the influence of the phenomenon, and this becomes a factor to cause a read error.

However, when either one of the memory function bodies 2a and 2b located on both sides of the gate electrode 1 is referred to, the storage state of the memory function body 2b or 2a located on the side opposite from the memory function body 2a or 2b to be referred to with respect to the gate electrode 1 exerts little influence on the read current. Therefore, it becomes possible to reduce the fluctuation in the device characteristics of the reference cell 27r during read to the ignorable extent.

As one example, a case where the information piece stored in the memory cell 27m shown in FIG. 2 is read is described below.

First of all, when the information piece stored in the memory function body 27ml of the memory cell 27m is read, a current flows through the bit line 29m1 by the memory cell 27m by, for example, turning off the column selector 26m2 to ground the bit line 29m2, applying a voltage of 2 V to a word line 28m2 and applying a voltage of 1.8 V to the bit line 29m1 by turning on a p-type FET 24m and column selectors 25*m* and 26*m*1. The current passes through the column selectors 26*m*1 and 25*m*, and a voltage (output) 23*m* at a node between the FET 24*m* and the column selector 25*m* is inputted to the sense amplifier 22.

On the other hand, a current flows through the bit line 29*r*1 by the reference cell 27*r* by grounding the bit line 29*r*2, applying a voltage of 2 V to a word line 28*r*2 and applying a voltage of 1.8 V to a bit line 29*r*1 by turning on the p-type FET 24*r* and column selectors 25*r* and 26*r*1 under the control of a read controller 500. The current passes through the column selectors 26*r*1 and 25*r*, and a voltage (output) 23*r* at a node between the FET 24*r* and the column selector 25*r* is inputted to the sense amplifier 22.

The sense amplifier 22 reads the information piece stored in the memory function body 27*ml* by comparing an output 23*m* from the memory cell 27*m* and an output 23*r* from the reference cell 27*r*.

Moreover, when the information piece stored in the memory function body 27*mr* of the memory cell 27*m* is read, a current flows through the bit line 29*m*2 by the memory cell 27*m* by turning off the column selector 26*m*1 to ground the bit line 29*m*1, applying a voltage of 2 V to a word line 28*m*2 and applying a voltage of 1.8 V to the bit line 29*m*2 by turning on the FET 24*m* and the column selectors 25*m* and 26*m*2. The current passes through the column selectors 26*m*2 and 25*m*, and a voltage (output) 23*m* at a node between the FET 24*m* and the column selector 25*m* is inputted to the sense amplifier 22.

On the other hand, in the reference cell 27*r*, the information piece stored in the memory function body 27*r*1 is referred to as in the case where the information piece stored in the memory function body 27*ml* of the memory cell 27*m* is read by the read controller 500 without referring to the information piece stored in a memory function body 27*rr*, and the information piece is transferred to the sense amplifier 22. As described above, the read controller 500 executes control so that only the memory function body 27*rl* on one side of the reference cell 27*r* is referred to.

The distance of the bit line extending from the memory cell 27*m* to the column selectors 26*m*1 and 26*m*2 is equal to the distance of the bit line extending from the reference cell 27*r* to the column selector 26*r*1.

Therefore, the influence of the voltage drop of the bit lines 29*m*1, 29*m*2 and 29*r*1 caused by the wiring resistance of the bit lines 29*m*1, 29*m*2 and 29*r*1 can be roughly equalized, so that accurate read can be achieved.

Moreover, the number of stages of the column selectors 26*m*1 or 26*m*2, and 25*m*, which exist between the memory cell 27*m* and the sense amplifier 22 is equal to the number of stages of the column selectors 26*r*1 and 25*r*, which exist between the reference cell 27*r* and the sense amplifier 22.

Therefore, the influences of voltage drops attributed to the on-state resistance of the column selector 26*m*1 or 26*m*2 and the column selector 25*m* and the on-state resistance of the column selectors 26*r*1 and 25*r* can be roughly equalized, so that accurate read can be achieved.

The relation between the output levels of the memory cells and the reference cells shown in FIG. 2 is described with reference to FIG. 5.

Figure 5:
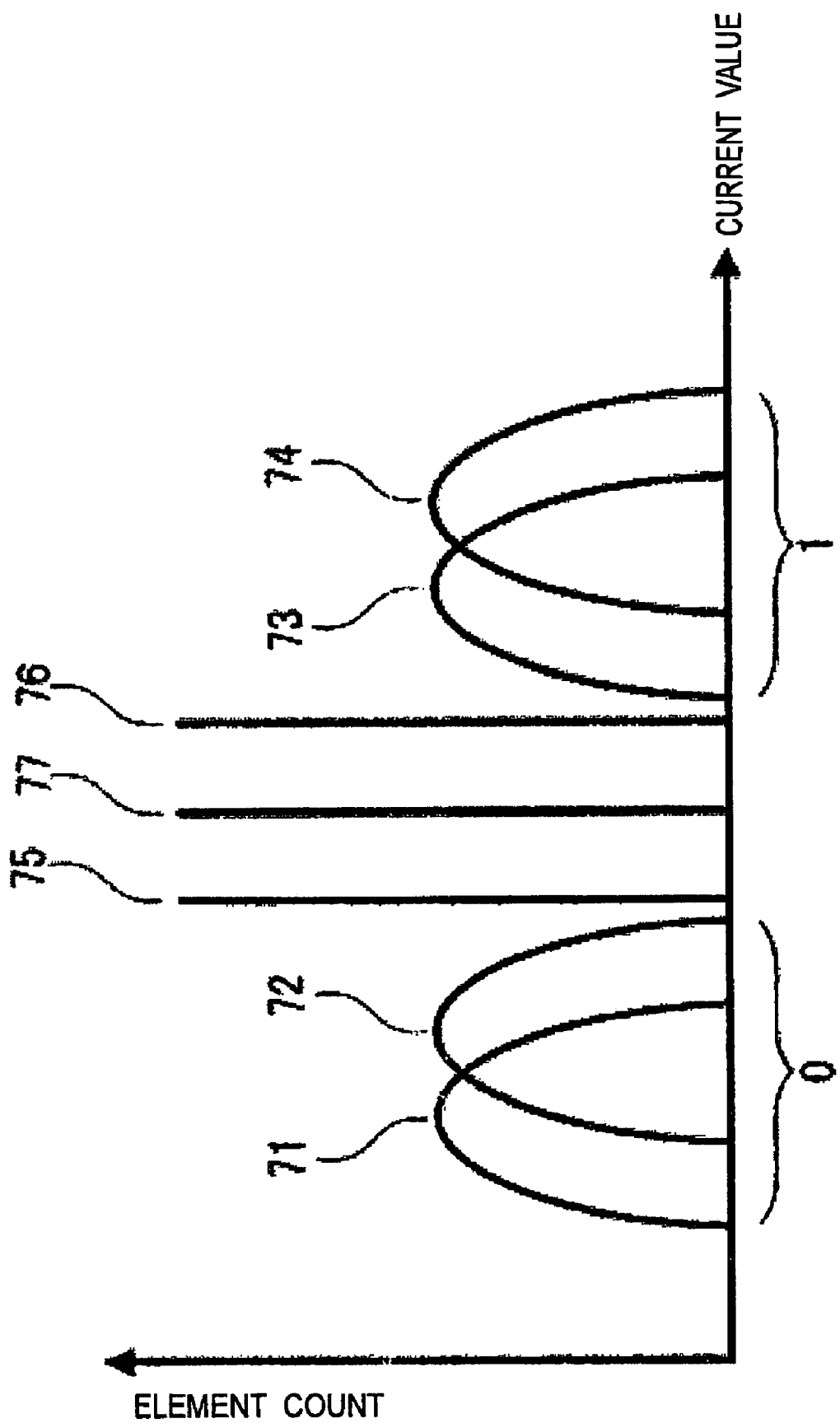
FIG. 5 is a schematic diagram for explaining the current levels of memory cells and reference cells of the present invention.

FIG. 5 shows the current levels during the read operation when one bit is stored in one memory function body.

In FIG. 5, reference numerals 71 and 72 indicate distribution of memory cells in the case where the memory function body on the read side is in the program state, i.e., in the case where the information piece of "0" is stored.

Moreover, reference numerals 73 and 74 indicate distribution of memory cells in the case where the memory function body is in the erase state, i.e., in the case where the information piece of "1" is stored.

Moreover, a reference level for determining that the memory function body is correctly programmed is defined as a program level 75, and a reference level for determining that the memory function body is correctly erased is defined as an erase level 76.

In this case, a reference level 77 that reflects the storage state of the memory function body referred to in the reference cell should preferably be in a state intermediate between the program level 75 and the erase level 76.

According to the construction, only by determining the magnitude relation between the reference level 77 of the reference cell and the current level of the memory cell, the storage state of the memory function body can easily be determined.

It is noted that the storage state of the memory function body located on the side opposite from the memory function body on the read side across the gate electrode sometimes influences the current level under specified voltage conditions.

The reference numerals 71 and 73 indicate the current levels when the memory function body located on the side opposite from the memory function body on the read side is in the program state, while the reference numerals 72 and 74 indicate the current levels when the memory function body located on the side opposite from the memory function body on the read side is in the erase state.

As shown in FIG. 5, a minute difference occurs in the current level of the memory cell depending on the storage state of the memory function body located on the side opposite with respect to the gate electrode from the memory function body on the read side.

Therefore, the storage state of the memory function body located on the side opposite from the memory function body on the reference side in each reference cell should desirably be unified in a roughly identical state with regard to all the reference cells.

With the arrangement, a variation in the reference current attributed to the storage state of the memory function body located on the side opposite with respect to the gate electrode from the memory function body on the reference side can be suppressed.

Further, in the reference cell, the storage state of the memory function body located on the side opposite from the memory function body on the reference side with respect to the gate electrode should desirably be programmed in a state intermediate between the program state and the erase state.

When storing independent information piece of two bits in one memory cell, the storage state of the memory function body located on the side opposite with respect to the gate electrode from the memory function body on the read side can be considered to be both the program state and the erase state.

With the arrangement of the reference cell, a sufficient current margin can be secured between the reference level 77 and the program level 75 and between the reference level 77 and the erase level 76, taking into consideration the variation in the current level attributed to the storage state of the memory function body located on the side opposite with respect to the gate electrode from the memory function body on the read side in such a memory cell, and faster read operation can be achieved.

Although the case where the information piece of one bit is stored in the memory function body has been described above, it is acceptable to store information piece of a plurality of bits.

Figure 6:
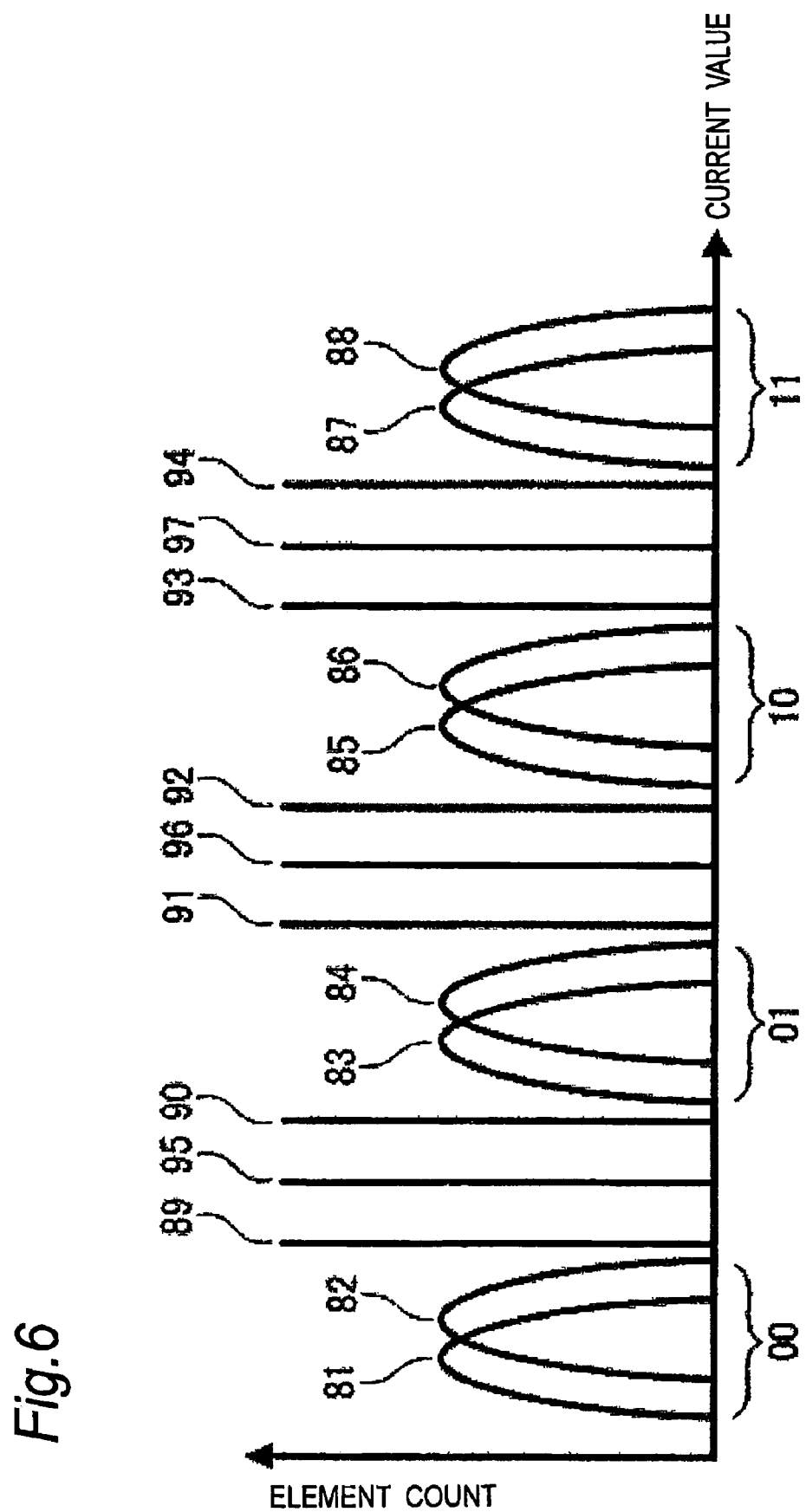
FIG. 6 is a schematic diagram for explaining the current levels of memory cells and reference cells of the present invention.

As one example of the case, FIG. 6 shows the relation of the memory cell distribution (element count) to the current level when two bits are stored in one memory function body.

In the case of two-bit storage, the four storage states of 00, 01, 10 and 11 as shown in FIG. 6 exist, and reference current levels 89 through 94, which serve as references to determine whether the storage states have the correct storage levels with regard to the respective storage states.

Moreover, reference levels 95 through 97 for reading the information pieces stored in the memory cell should preferably be set between the respective reference levels.

Although not shown, a circuit for reading the storage states as shown in FIG. 6 is able to prepare reference cells corresponding to the reference levels 95 through 97 and read the information pieces stored in the memory function bodies by proper switchover among the reference cells.

Also, in this case, only the information piece stored in the memory function body located on one side of the gate electrode is referred to in the reference cell.

Moreover, as in the case where the information piece of one bit is stored in one memory function body, the storage state of the memory function body located on the side opposite from the memory function body on the reference side with respect to the gate electrode should desirably be unified in a roughly identical state with regard to all the reference cells. Furthermore, the storage state of the memory function body located on the side opposite with respect to the gate electrode from the memory function body on the reference side should desirably be in a state intermediate between two reference levels for distinguishing data.

(Second Embodiment)

Figure 3:
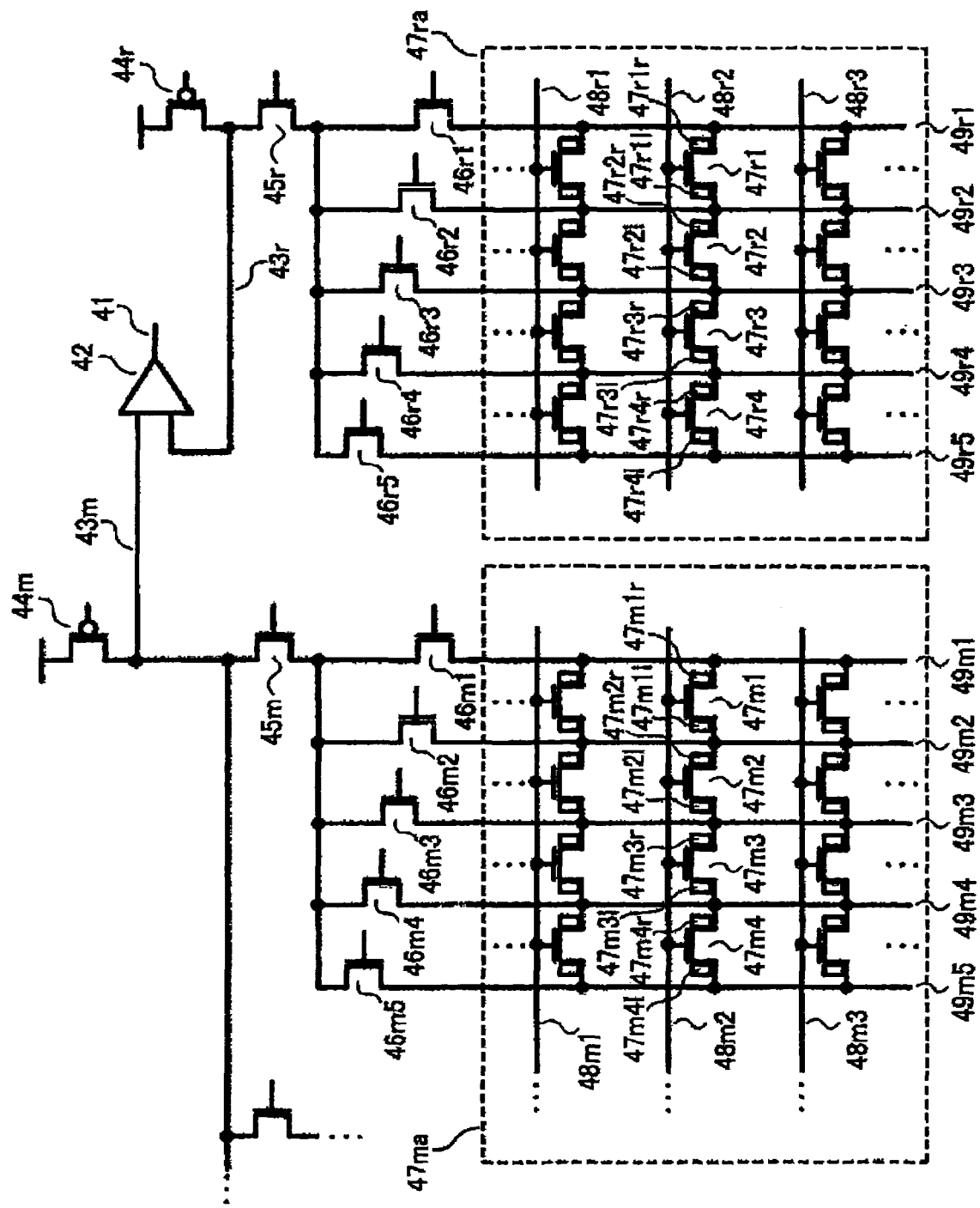
FIG. 3 is a circuit diagram of one embodiment of the semiconductor storage device of the present invention.

FIG. 3 shows the second embodiment of the semiconductor storage device of the present invention.

The present second embodiment has a so-called virtual ground array architecture, in which adjacent cells (elements) of each of a memory cell array 47*ma* and a reference cell array 47*ra* share a bit line.

In the virtual ground array architecture, which is able to increase the cell density in comparison with the cell arrangement as shown in FIG. 2, the adjacent cells share a diffusion region. Therefore, a potential difference is also generated between the source and the drain of the adjacent memory cell in accordance with a change in the voltage of the bit line, and a current from the memory cell flows not only in the direction of the bit line but also in the source-to-drain direction of the adjacent memory cell when read operation is executed.

For example, when the information piece stored in a memory function body 47*m3l* of a memory cell 47*m3* is read, a bit line 49*m4* is grounded, a voltage of 2 V is applied to a word line 48*m2*, and a voltage of 1.8 V is applied to a bit line 49*m3*. Further, the information piece stored in the memory function body 47*m3l* is read by applying a voltage of 1.8 V to the bit lines 49*m1* and 49*m2* simultaneously with the operation so that no current flows between the source and the drain of the memory cells 47*m1* and 47*m2*.

However, the potential of the bit line 49*m3* changes according to the information piece stored in the memory function body 47*m3l* by the read operation. In accordance with the change, a potential difference is generated between the source and the drain of the memory cell 47*m2*, and a current flows between the source and the drain. A change occurs in the potential of the bit line 49*m2* due to the current between the source and the drain of the memory cell 47*m2*. Further, a potential difference occurs between the source and the drain of the memory cell 47*m1* in accordance with the operation, and a current flows between the source and the drain.

As described above, a so-called sneak current flows also in the source-to-drain direction of the memory cells connected in series in the direction other than the direction of the bit line in accordance with the read operation.

Therefore, when the memory cell arrangement has the virtual ground array architecture, it is preferable to employ a virtual ground array architecture for the reference cell array as in the memory cell array in order to take the influence of the sneak current into consideration.

However, also in this case, only one memory function body is referred to with regard to one reference cell as in the first embodiment.

For example, when the information pieces stored in the memory function bodies 47*m1r* and 47*m4l* in the memory cells 47*m1* and 47*m4* are read, the memory function body 47*r1r* in the reference cell 47*r1* is referred to, and the memory function body 47*r4l* in the reference cell 47*r4* is not referred to.

Likewise, when the information pieces stored in the memory function bodies 47*m1l* and 47*m4r* in the memory cells 47*m1* and 47*m4* are read, the memory function body 47*r4r* in the reference cell 47*r4* is referred to, and the memory function body 47*r1l* in the reference cell 47*r1* is not referred to.

Moreover, when the information pieces stored in the memory function bodies 47*m2r* and 47*m3l* in the memory cells 47*m2* and 47*m3* are read, the memory function body 47*r2r* in the reference cell 47*r2* is referred to, and the memory function body 47*r3l* in the reference cell 47*r3* is not referred to.

Further, when the information pieces stored in the memory function bodies 47*m2l* and 47*m3r* in the memory cells 47*m2* and 47*m3* are read, the memory function body 47*r3r* in the reference cell 47*r3* is referred to, and the memory function body 47*r2l* in the reference cell 47*r2* is not referred to.

As in the case of the first embodiment, the storage state of the memory function body located on the side opposite from the memory function body on the read side in each reference cell should desirably be unified in a roughly identical state with regard to all the reference cells. Furthermore, the storage state of the memory function body located on the side opposite with respect to the gate electrode from the memory function body on the reference side should desirably be in a state intermediate between the program state and the erase state.

Although four cells are connected in series in the memory cell array 47*ma* and the reference cell array 47*ra* in the present second embodiment, the arrangement is not inflexible, and the number may be not smaller than four or smaller than four.

Moreover, although the number of the memory elements (memory cells) connected in series in the memory cell array 47*ma* has been made equal to the number of the reference elements (reference cells) connected in series in the reference cell array 47*ra* in the present second embodiment, the arrangement is not inflexible.

In general, the greater the number of memory cells connected in series, the higher the recording density of the memory cell array results.

However, there is a problem that a circuit area occupied by the reference cell array is increased when a memory cell array in which numbers of memory cells are connected in series and a reference cell array in which reference cells of the same number as that of the memory cells in the memory cell array are connected in series are employed.

Therefore, particularly when numbers of memory cells are connected in series in the memory cell array attaching importance to the area, the number of the reference cells connected in series in the reference cell array may be made smaller than the number of the memory cells connected in series in the memory cell array in order to reduce the occupation ratio of the reference cell array.

It is desirable to equalize the numbers in order to more strictly reflect the influence of the sneak current and achieve highly reliable read operation. However, as described above, the sneak current is generated in a domino style with respect to the adjacent elements, and the time of read by the sense amplifier is generally shorter than the time during which the potential of the bit lines in the cell array enters a stable state, and therefore, the numbers need not necessarily be equalized.

(Third Embodiment)

Figure 4:
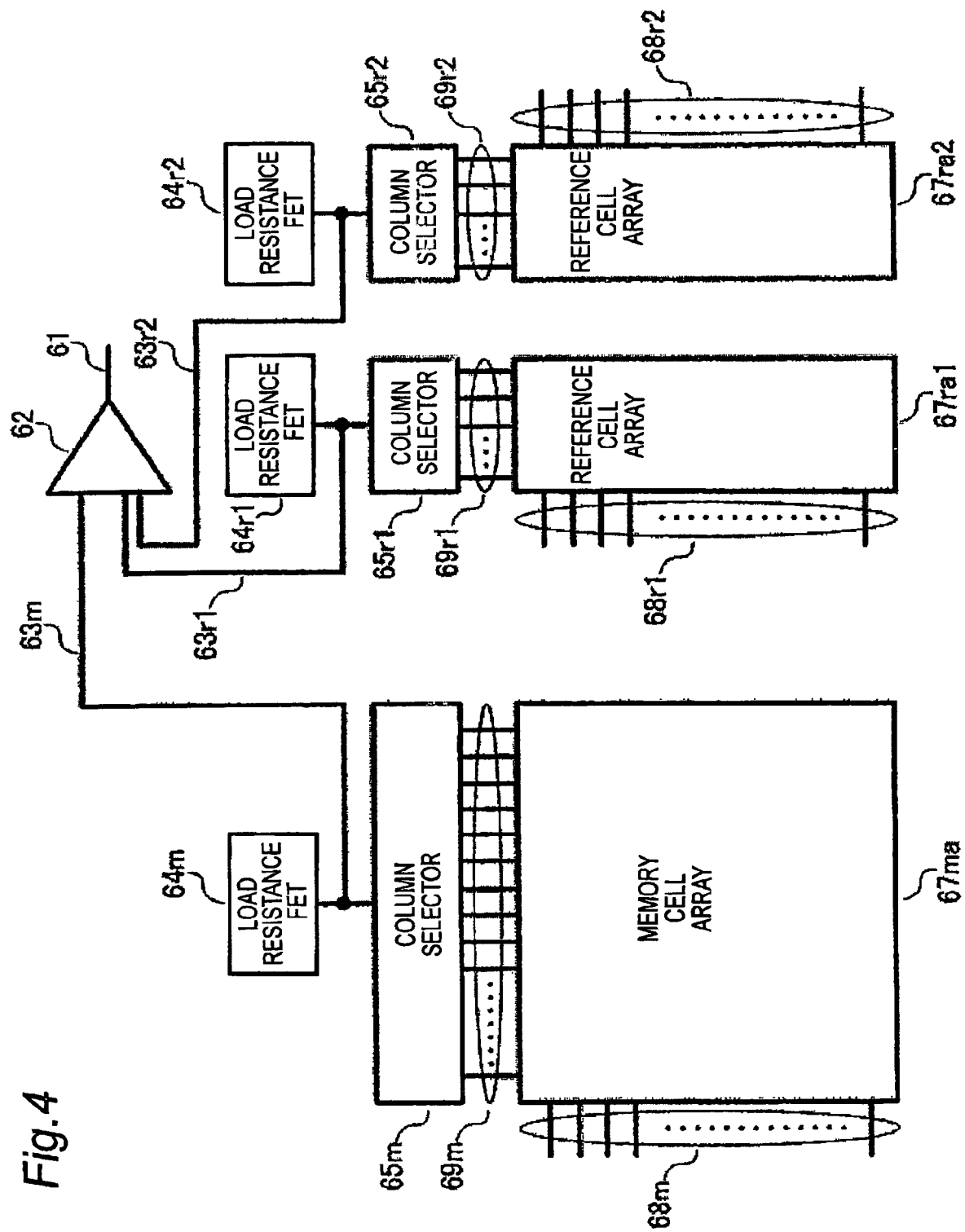
FIG. 4 is a circuit block diagram of one embodiment of the semiconductor storage device of the present invention.

FIG. 4 shows the third embodiment of the semiconductor storage device of the present invention.

Memory cells (not shown) that constitute a memory cell array 67*ma* are connected to a sense amplifier 62 through a column selector 65*m*. On the other hand, reference cells that constitute reference cell arrays 67*ra*1 and 67*ra*2 are also connected to the sense amplifier 62 through column selectors 65*r*1 and 65*r*2. In the sense amplifier 62, an output 63*m* from the memory cell is compared with outputs 63*r*1 and 63*r*2 from the reference cells, and the information piece stored in the memory cell is consequently read. It is noted that reference numerals 64*m*, 64*r*1 and 64*r*2 are field-effect transistors that are connected to a constant voltage source and operate as a load resistance during read.

As in the first and second embodiments, both the memory cell and the reference cell of the present third embodiment have the structure shown in FIG. 1A. In the memory cell, the memory function bodies located on both sides of the gate electrode are able to store mutually independent information pieces. Also, The information pieces are independently read therefrom. By contrast, in the reference cell, only the information piece stored in either one of the memory function bodies located on both sides of the gate electrode is referred to. However, the present third embodiment further has a reference cell array 67*ra*1 that includes reference cells to refer to the current level in the program state and a reference cell array 67*ra*2 that includes reference cells to refer to the current level in the erase state.

According to the construction, the reference cells that constitute the reference cell arrays 67*ra*1 and 67*ra*2 have a storage state identical to one storage state of the memory cells that constitute the memory cell array. Therefore, the memory cells and the reference cells change with same tendency with respect to changes in the applied voltage, temperature and the like, read operation of higher reliability can be achieved.

The circuit structures of the memory cell array 67*ma* and the reference cell arrays 67*ra*1 and 67*ra*2 should preferably have either one of the structures of the first embodiment and the second embodiment, the structures being alternatively allowable.

Moreover, the storage state of the memory function body located on the side opposite with respect to the gate electrode from the memory function body on the reference side is unified in a roughly identical state with regard to all the reference cells. Further, in the reference cells that constitute the reference cell array 67*ra*1 to refer to the current level in the program state, the memory function bodies located on the side opposite with respect to the gate electrode from the memory function bodies in the program state are all put into the erase state. Moreover, in the reference cells that constitute the reference cell array 67*ra*2 to refer to the current level in the erased state, the memory function bodies located on the side opposite with respect to the gate electrode from the memory function body in the erase state are all put into the program state.

According to the construction, as shown in FIG. 5, both the reference cell in the program state and the reference cell in the erase state have a storage state similar to that of the memory cell in the worst case. The performance of the read operation depends on a current difference between the current that flows from the reference cell and the current that flows from the memory cell in the worst case. By making the reference cell have storage states similar to those in the program state and the erase state of the memory cell in the worst case, no significant change occurs in the current difference between the current that flows from the reference cell and the current that flows from the memory cell in the worst case with respect to the changes in the applied voltage, ambient temperature and the like, and read operation of higher reliability can be achieved.

In the present third embodiment, as the current level of the reference cell in the program state comes closer to the program level and the current level of the reference cell in the erase state comes closer to the erase level, the sum of both levels comes closer to the double of the desired reference level, so that read operation of higher reliability can be achieved.

The comparison method in the sense amplifier 62 may be any method and should preferably compare the double of the output 63*m* of the memory cell with the sum of the outputs 63*r*1 and 63*r*2 from the reference cells.

According to the arrangement, highly reliable read operation having a sufficient margin can be achieved in comparison with, for example, the method of comparing the output 63*m* of the memory cell with a half value of the sum of the outputs 63*r*1 and 63*r*2 from the reference cells.

(Fourth Embodiment)

Figure 7:
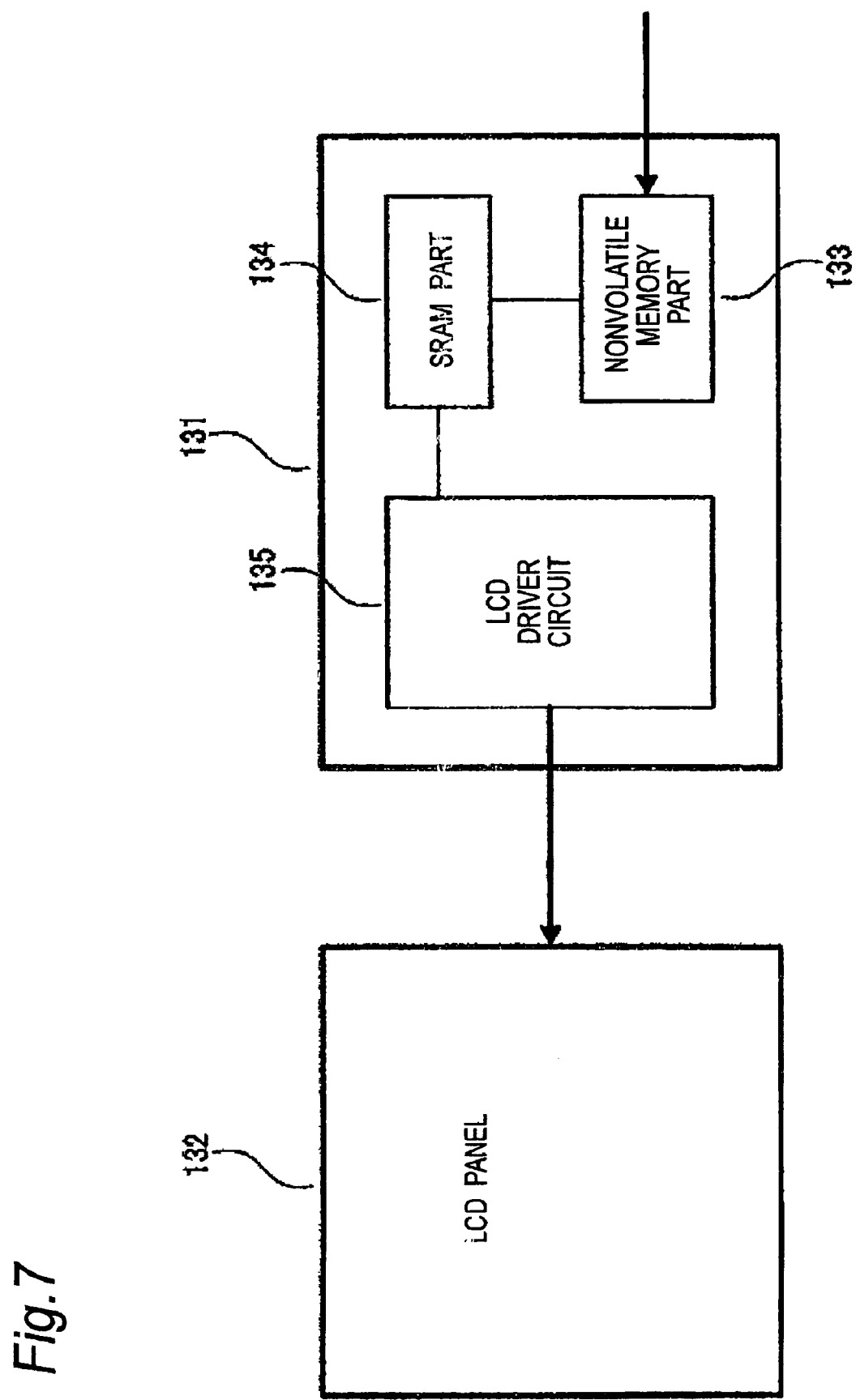
FIG. 7 is a schematic block diagram of an LCD driver into which the semiconductor storage device of the present invention is incorporated.

As an application example of the semiconductor storage device described above, a rewritable nonvolatile memory for image adjustment of a LCD (Liquid Crystal Display) panel in an LCD device as one example of an electronic equipment as shown in, for example, FIG. 7 can be enumerated.

The LCD panel 132 is driven by an LCD driver 131. A nonvolatile memory part 133, an SRAM (Static Random Access Memory) part 134 and an LCD driver circuit 135 are included in the LCD driver 131. The nonvolatile memory part 133 is constructed of the semiconductor storage device of the present invention. The nonvolatile memory part 133 has an externally rewritable structure.

The information stored in the nonvolatile memory part 133 is transferred to the SRAM part 134 when the power of the equipment is turned on. The LCD driver circuit 135 can read the storage information from the SRAM part 134 at need. By providing the SRAM part 134, the read speed of the storage information can be increased.

The LCD driver circuit 131 may be externally attached to the LCD panel 132 as shown in FIG. 7 or allowed to be formed on the LCD panel 132.

Although the LCD panel 132 changes the gradation of display by applying multi-stage voltages to each of pixels, the relation between the applied voltage and the gradation of display varies in each product. Therefore, by storing information for correcting the variation of each individual product after the product is completed and executing correction based on the information, the image qualities of products can be uniformed. Therefore, it is preferable to mount a rewritable nonvolatile memory for storing correction information. Moreover, it is preferable to employ the highly reliable inexpensive semiconductor storage device of the present invention as the nonvolatile memory.

If the semiconductor storage device of the present invention is employed as the nonvolatile memory for image adjustment of the LCD panel, it becomes possible to provide LCD panels, which have high reliability and of which the image qualities of products are uniform, at low cost.

(Fifth Embodiment)

Figure 8:
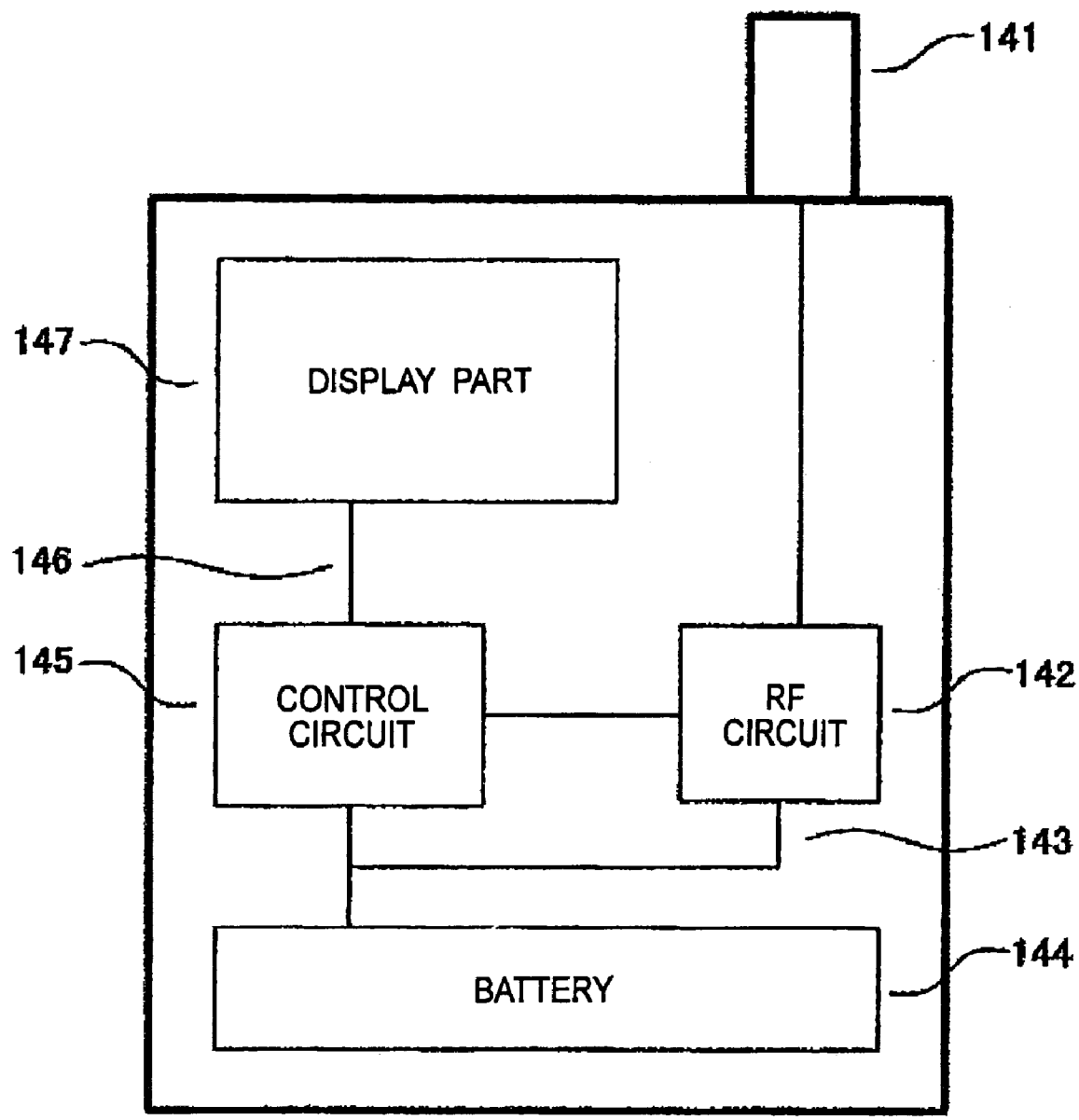
FIG. 8 is a schematic block diagram of portable electronic equipment into which the semiconductor storage device of the present invention is incorporated.
Figure 9A:
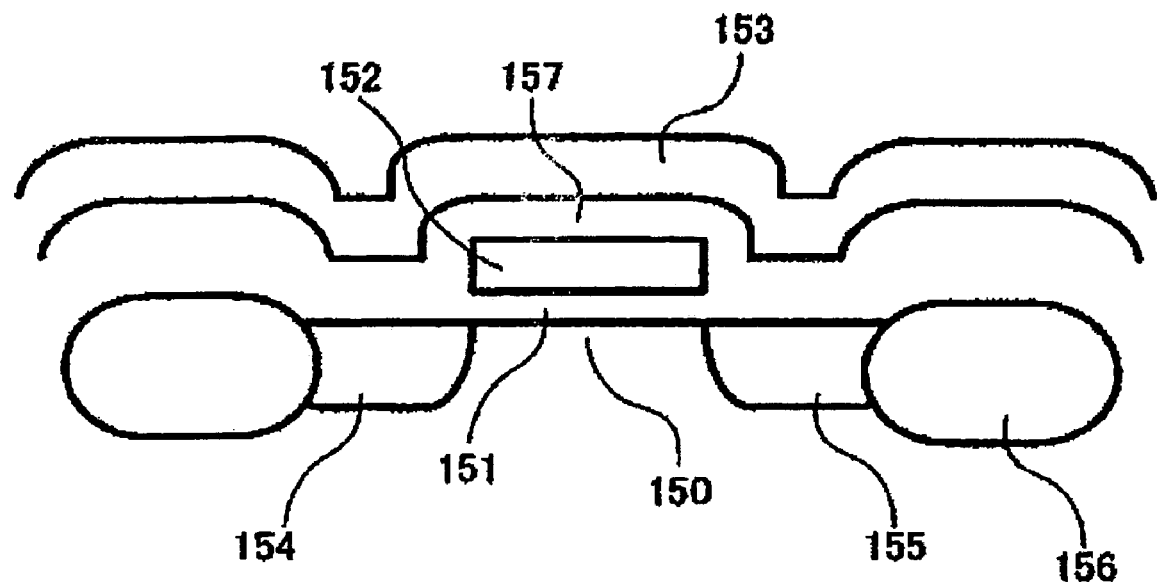
FIG. 9A is a sectional view of a conventional flash memory.
Figure 9B:
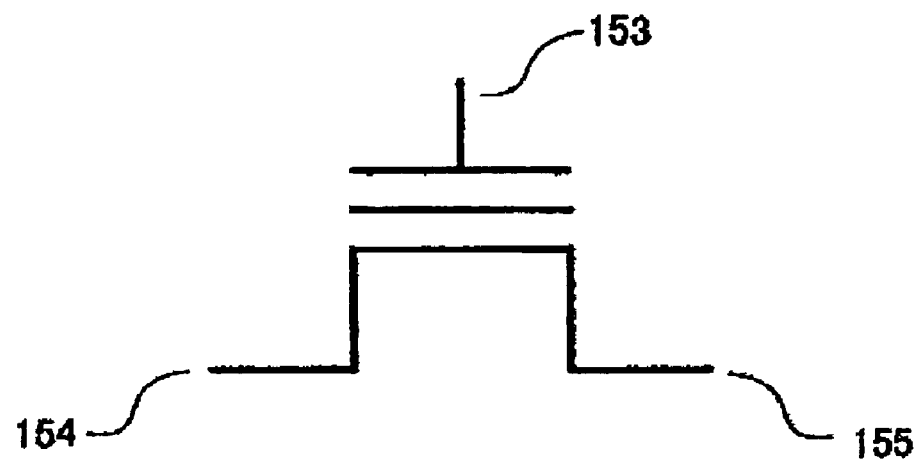
FIG. 9B is a circuit symbol of the conventional flash memory.

FIG. 8 shows a portable telephone of one example of a portable electronic equipment into which the semiconductor storage device described above is incorporated.

The portable telephone is constituted mainly of a control circuit 145, a battery 144, an RF (Radio Frequency) circuit 142, a display part 147, an antenna 141, a signal line 146, a power line 143 and so on. The semiconductor storage device of the present invention described above is incorporated into the control circuit 145.

As described above, by employing the inexpensive semiconductor storage device, which has high reliability by solving the problem of read disturb and of which the process of consolidating the memory part with the logic circuit is simple, for the portable electronic equipment, highly reliable inexpensive portable electronic equipment can be obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage device comprising:
   a memory cell array in which a plurality of memory cells for storing information pieces are arranged;
   a sense amplifier for reading information pieces stored in the memory cells; and
   one or a plurality of reference cells referred to read data stored in the memory cells by the sense amplifier, wherein
   each of the memory cell and the reference cell comprises:
   a gate electrode formed via a gate insulation film on a semiconductor layer;
   a channel region arranged under the gate electrode via the gate insulation film;
   diffusion regions, which are arranged on both sides of the channel region and have a conductive type opposite to a conductive type of the channel region; and
   memory function bodies, which are formed on both sides of the gate electrode and have a function to retain electric charge or polarization, wherein
   in each of the memory cells, information pieces independent from each other are stored in the memory function bodies located on both sides of the gate electrode, and the information pieces are independently read from the memory function bodies, and wherein
   in the reference cell, only the information piece stored in the memory function body located on one side of the gate electrode is referred to.

2. The semiconductor storage device as claimed in claim 1, wherein
   the memory function body to be referred to in the reference cell and the memory function body located on a side opposite with respect to the gate electrode from the memory function body to be referred to in the reference cell are both written in a state intermediate between a program state and an erase state.

3. The semiconductor storage device as claimed in claim 1, wherein
   the reference cells comprise at least first and second reference cells,
   the memory function body referred to in the first reference cell is in the program state, and
   the memory function body referred to in the second reference cell is in the erase state.

4. The semiconductor storage device as claimed in claim 3, wherein
   the memory function body located on a side opposite with respect to the gate electrode from the memory function body in the program state referred to in the first reference cell is in the erase state.

5. The semiconductor storage device as claimed in claim 3, wherein
   the memory function body located on a side opposite with respect to the gate electrode from the memory function body in the erase state referred to in the second reference cell is in the program state.

6. The semiconductor storage device as claimed in claim 3, wherein,
   by comparing double of a current supplied from the memory cell with a sum of currents supplied from the first and second reference cells in the sense amplifier, the information piece stored in the memory function body of the memory cell is read.

7. The semiconductor storage device as claimed in claim 1, wherein
   a number of stages of column selectors existing between the memory cell and the sense amplifier is equal to a number of stages of column selectors existing between the reference cell and the sense amplifier.

8. The semiconductor storage device as claimed in claim 1, further comprising
   a reference cell array constituted of the reference cells, wherein
   the memory cell array and the reference cell array are respectively constituted of a virtual ground array architecture.

9. The semiconductor storage device as claimed in claim 8, wherein
   the number of reference cells connected in series in the reference cell array is equal to the number of memory cells connected in series in the memory cell array.

10. The semiconductor storage device as claimed in claim 1, further comprising
    a read controller for executing control to refer to only the information piece stored in the memory function body located on one side among the memory function bodies located on both sides of the gate electrode of the reference cell.

11. Electronic equipment comprising the semiconductor storage device of claim 1.

* * * * *